United States Patent [19]

Yoshisato et al.

[11] 4,224,580
[45] Sep. 23, 1980

[54] QUARTZ CRYSTAL OSCILLATOR

[75] Inventors: Akiyuki Yoshisato; Katsumi Tobita, both of Soma, Japan

[73] Assignee: Alps Electric Co., Ltd., Tokyo, Japan

[21] Appl. No.: 958,246

[22] Filed: Nov. 6, 1978

Related U.S. Application Data

[63] Continuation of Ser. No. 805,860, Jun. 13, 1977, abandoned.

[30] Foreign Application Priority Data

Jun. 18, 1976 [JP] Japan .................................. 51-79913

[51] Int. Cl.² .......................... H03B 5/06; H03B 5/36
[52] U.S. Cl. ................................. 331/116 R; 331/158
[58] Field of Search ........ 331/116 R, 116 M, 116 FE, 331/154–163, 183, 186

[56] References Cited

U.S. PATENT DOCUMENTS 3,559,100   1/1971   Grib et al. ........................ 331/116 M

FOREIGN PATENT DOCUMENTS 34476 11/1968 German Democratic Rep. ..... 331/116 R
510767 6/1976 U.S.S.R. .............................. 331/116 R

OTHER PUBLICATIONS

Gare, "A 70 to 432 MHz transmitter converter" Radio Communication, Nov. 1975, pp. 838–842.

*Primary Examiner*—Siegfried H. Grimm
*Attorney, Agent, or Firm*—Guy W. Shoup; Gerard F. Dunne

[57] ABSTRACT

A Colpitts type quartz crystal oscillator comprises a resonant circuit consisting of two capacitors connected in series across a quartz crystal, the latter serving as an inductive element. The resonant circuit is connected between the base and collector of a transistor, with the junction of the capacitors being connected to the emitter of the transistor to provide feedback. Means are provided to increase the gain of the transistor and thereby the driving excitation of the crystal above a normal value for a brief length of time after the oscillator is initially energized.

6 Claims, 6 Drawing Figures

QUARTZ CRYSTAL OSCILLATOR

This application is a continuation of application Ser. No. 805,860 filed June 13, 1977 and now abandoned.

BACKGROUND OF THE INVENTION

The present invention relates to a Colpitts type quartz crystal oscillator.

Quartz crystal oscillators are popular in the art due to their extremely good frequency stability. However, a problem has heretofore remained unsolved regarding stability of oscillation. The equivalent resistance of the crystal of such oscillators is typically between 50 and 100 ohms when the driving excitation, or the amplitude of the oscillating voltage across the crystal, is below a predetermined value and drops down to about 10 ohms when the driving excitation exceeds the predetermined value. With the low driving excitation it is impossible in some cases to get oscillation to occur. In cases where oscillation does occur with low driving excitation, the stability of oscillation is quite poor.

Increasing the driving excitation above the predetermined value where the equivalent resistance drops will ensure that stable oscillation will occur. However, the intensity of oscillation is so high that second, third and higher order harmonics are generated and the oscillator signal may be undesirably coupled to other sections of the electrical apparatus in which the oscillator is incorporated.

SUMMARY OF THE INVENTION

The present invention utilizes the principle of quartz crystals in accordance with which if the driving excitation of a crystal is increased above the level at which the equivalent resistance of the crystal drops, the equivalent resistance will remain low if the driving excitation is subsequently reduced below this level.

Thus, the present invention comprises a Colpitts type quartz crystal oscillator incorporating novel means to briefly increase the driving excitation above the level at which the equivalent resistance of the crystal drops upon initial energization of the oscillator and reduce the driving excitation below this level for normal operation of the oscillator.

It is an object of the present invention to provide a quartz crystal oscillator which ensures stable oscillation.

It is another object of the present invention to provide a crystal oscillator which eliminates generation of second, third and higher order harmonics.

It is another object of the present invention to provide a quartz crystal oscillator which prevents undesired coupling of the oscillator signal to other electrical apparatus.

It is another object of the present invention to provide a quartz crystal oscillator which consumes a small amount of power compared to prior art oscillators, thereby effecting substantial economies.

It is another object of the present invention to provide a generally improved quartz crystal oscillator.

Other objects, together with the foregoing, are attained in the embodiments described in the following description and illustrated in the accompanying drawing.

DESCRIPTION OF THE PREFERRED EMBODIMENTS

While the crystal oscillator of the invention is susceptible of numerous physical embodiments, depending upon the environment and requirements of use, substantial numbers of the herein shown and described embodiments have been made, tested and used, and all have performed in an eminently satisfactory manner.

Figure 1:
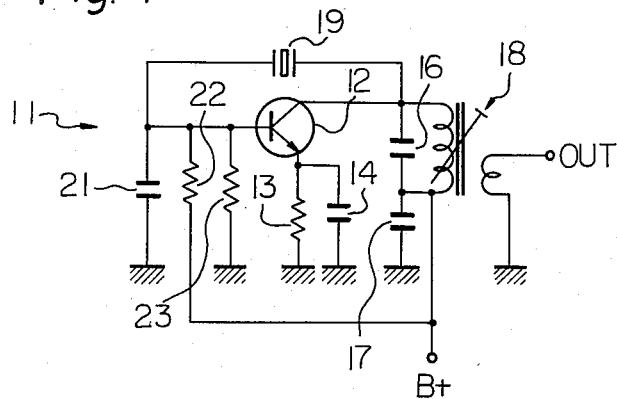
FIG. 1 is an electrical schematic diagram of a prior art crystal oscillator.

Referring now to FIG. 1 of the drawing, a prior art Colpitts type quartz crystal oscillator 11 comprises an NPN transistor 12 connected in a common base configuration. The emitter of the transistor 12 is grounded through the parallel combination of a resistor 13 and a bypass capacitor 14 which serve to stabilize the circuit against variations in temperature and the like. The collector of the transistor 12 is grounded through a capacitor 16 and a bypass capacitor 17. A variable inductance primary winding of an output transformer 18 is connected in parallel with the capacitor 16. One end of a secondary winding of the transformer 18 is grounded and the other end of the secondary winding constitutes the output of the oscillator 11. The junction of the capacitors 16 and 17 is connected to a positive D.C. power source B+. A quartz crystal 19 is connected between the base and collector of the transistor 12, the base of the transistor 12 being grounded through a capacitor 21. Resistors 22 and 23 are connected in series between the power source B+ and ground, with the junction of the resistors 22 and 23 being connected to the base of the transistor 12. The values of the resistors 13, 22 and 23 determine the forward bias voltage normally applied between the base and emitter of the transistor 12.

Figure 2:
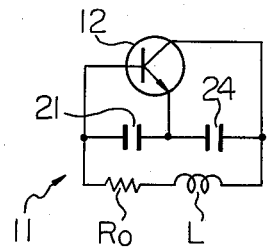
FIG. 2 is a simplified equivalent circuit diagram of the oscillator of FIG. 1.

The operation of the oscillator 11 can be most easily understood from an examination of the simplified equivalent circuit shown in FIG. 2. A capacitor 24 shown as being connected between the emitter and collector of the transistor 12 in FIG. 2 is constituted by the combined reactance of the capacitor 16 and primary winding of the transformer 18. This reactance is capacitive since the capacitive reactance of the capacitor 16 is selected to be larger than the inductive reactance of the primary winding of the transformer 18 at the frequency of operation of the oscillator 11. The reactance of the crystal 19 is inductive, and the crystal 19 is constituted in FIG. 2 as an inductance L in series with an equivalent resistance Ro. A parallel resonant circuit (not designated) which is connected between the base and collector of the transistor 12 is constituted by the capacitors 21 and 24 in parallel with the inductance L, the resistive portion of the resonant circuit being constituted by Ro.

The transistor 12 acts as an active element for driving the resonant circuit. Positive feedback is applied to the emitter of the transistor 12 by tapping the junction of the capacitors 21 and 24. The inductance of the primary winding of the transformer 18 is made variable to adjust the oscillator frequency to the desired value and compensate for manufacturing tolerances in the values of the various components of the oscillator 11.

Figure 3:
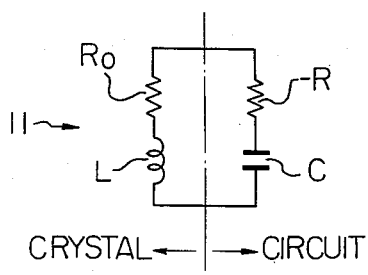
FIG. 3 is a further simplified equivalent circuit diagram of the oscillator of FIG. 1.

FIG. 3 shows the oscillator 11 in further simplified form, with the combined value of the capacitors 21 and 24 being designated as C. The frequency of oscillation f is equal to $$f = 1/(2\pi\sqrt{L C})$$

The negative resistance or gain of the transistor 12 is designated as $-R$. In order for oscillation to be sustained in the oscillator 11, the gain $-R$ must be greater than the resistance Ro of the resonant circuit.

Figure 4:
FIG. 4 is a graph illustrating the relationship between equivalent resistance and driving excitation of a quartz crystal.

FIG. 4 shows the relationship between the driving excitation of the crystal 19 and the equivalent resistance Ro thereof. By driving excitation is meant the amplitude of the A.C. oscillating signal across the crystal 19, or the amplitude of oscillation of the resonant circuit. It will be seen that at excitation levels below E1 the resistance Ro is high, typically between 50 and 100 ohms. Under these conditions the oscillation is unstable. If $|Ro| > |-R|$, oscillation cannot occur.

Above E1 oscillation is stable but excessive, resulting in the generation of harmonics and undesired coupling of the oscillator signal to adjacent circuitry. Also, the power consumption is excessive.

Shown in solid line in FIG. 4 is the resistance Ro as the excitation is increased from zero to above E1. It will be seen that the resistance Ro remains high until the excitation reaches E1 and thereafter drops to a desirably low level, typically around 10 ohms. The broken line curve of FIG. 4 illustrates an important feature of the present invention, which occurs as the excitation is reduced from above E1 toward zero. It will be seen that the resistance Ro remains low even though the excitation is reduced far below E1. A drive level E2 is illustrated at which, when the excitation is reduced from above E1 to E2, stable oscillation is achieved without the generation of harmonics and undesired signal coupling.

Figure 5:
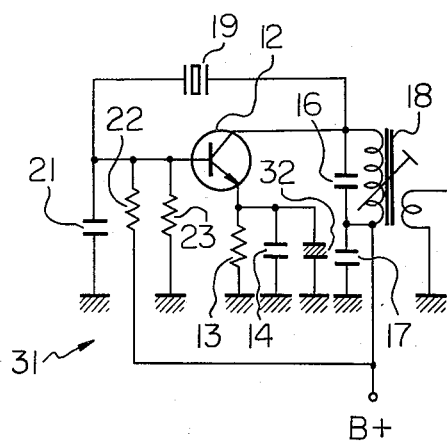
FIG. 5 is an electrical schematic diagram of a first embodiment of a crystal oscillator of the present invention.

FIG. 5 shows a first embodiment of the present invention which is designated as 31. Component parts of the crystal oscillator 31 which are essentially similar to those of the oscillator 11 are designated by the same reference numerals.

The oscillator 31 comprises a capacitor 32 of suitably large value connected between the emitter of the transistor 12 and ground, or between the emitter of the transistor 12 and the junction of the capacitors 21 and 24. With the oscillator 31 deenergized, the capacitor 32 is discharged. When the oscillator 31 is initally energized, the discharged capacitor 32, which is illustrated schematically to be an electrolytic capacitor, is equivalent to a short circuit between the emitter of the transistor 12 and ground, and a comparatively large amount of current flows through the capacitor 32 and transistor 12. This increases the gain or negative resistance $-R$ of the transistor 12 to a value such that the excitation exceeds E1. This causes the resistance Ro of the crystal 19 to drop from the initial high level down to the desired low level. As the capacitor 32 charges the current flow therethrough decreases exponentially down to substantially zero. Under these conditions, the current flow through the emitter of the transistor 12 is reduced to a low value which is dependent on the value of the resistor 13. This causes the excitation of the crystal 19 to drop down to the desired normal value of E2. In summary, the excitation is increased well above the normal level of E2 for a brief period of time after initial energization of the oscillator 31, thereby allowing the resistance Ro of the crystal 19 to drop down to the desired operating value.

Figure 6:
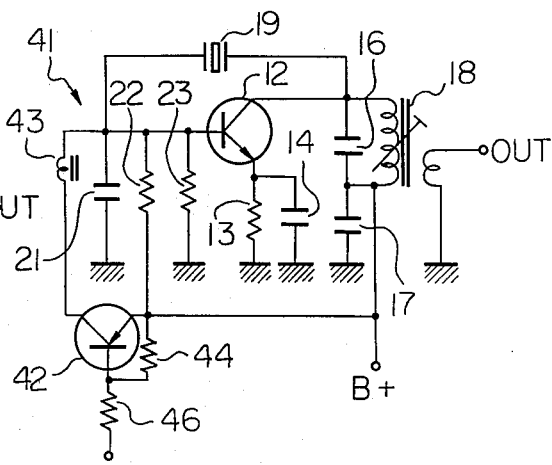
FIG. 6 is similar to FIG. 5 but shows a second embodiment.

FIG. 6 illustrates another crystal oscillator 41 embodying the present invention which comprises a PNP switching transistor 42. The collector of the transistor 42 is connected to the base of the transistor 12 through a choke coil 43. The emitter of the transistor 42 is connected directly to B+ and the base of the transistor 42 is connected to B+ through a bias resistor 44. A negative initialization pulse signal is adapted to be applied to the base of the transistor 42 through an input resistor 46.

Under normal conditions, the transistor 42 is biased into cutoff by the resistor 44 and has no effect on the remaining components of the oscillator 41. However, application of the negative pulse to the base of the transistor 42 causes the same to turn on and effectively short out the resistor 22. This has the effect of connecting the base of the transistor 12 to B+ and greatly increasing the forward bias voltage. This increases the gain $-R$ of the transistor 12 and the excitation of the crystal 19 in the manner described hereinabove with reference to FIGS. 4 and 5.

The negative initialization pulse is applied to the transistor 42 when the oscillator 41 is initially energized for a predetermined length of time which is sufficient to decrease the resistance Ro of the crystal 19. Where the oscillator 41 is employed as a local oscillator in a transceiver, the initialization pulse is applied when the function is switched from transmit to receive.

Thus, it will be seen that the present crystal oscillator operates in a stable manner and does not produce undesirable harmonics. The driving excitation is such that undesired coupling of the oscillator signal to other electrical apparatus is precluded. As yet another advantage, the power consumption of the present oscillator is low compared to the prior art.

Various modifications will become possible for those skilled in the art after receiving the teachings of the present disclosure without departing from the scope thereof. Although the present crystal oscillator has been shown and described as embodied in a Colpitts configuration, the basic principles of the invention may be applied to other crystal oscillator circuits.

What is claimed is:
1. A crystal oscillator comprising:
a resonant circuit including a crystal;
an active element connected to said resonant circuit for applying a driving excitation to said resonant circuit;
a first capacitor connected to said active element for stabilizing operation of said oscillator, said first capacitor having a relatively low impedance to signals in the frequency range of said oscillator;
feedback means connected between said resonant circuit and said active element for applying a feedback signal from said resonant circuit to said active element; and
initialization means including an electrolytic capacitor connected in parallel with said first capacitor for increasing the gain of said active element above a normal value for a predetermined length of time after initial energization of the oscillator.

2. A crystal oscillator as in claim 1, in which the active element comprises a transistor.

3. A crystal oscillator as in claim 2, in which the resonant circuit, transistor and feedback means are connected in a Colpitts configuration.

4. A crystal oscillator as in claim 3, in which the resonant circuit comprises two capacitors connected in series between a base and a collector of the transistor, the crystal being connected between the base and collector of the transistor, a junction of said two capacitors being connected to an emitter of the transistor.

5. A crystal oscillator as in claim 1, said active element being constituted by a transistor, and said resonant circuit, said transistor and said feedback means are connected in a Colpitts configuration in which the resonant circuit comprises two capacitive elements connected in series between the base and the collector of said transistor, the crystal being connected between the base and collector of said transistor, and the junction of said two capacitive elements being connected to the emitter of said transistor, and said initialization capacitor being connected between said emitter and said junction.

6. A crystal oscillator as in claim 1, said initialization capacitor being an electrolytic capacitor having a capacitance larger than that of said first capacitor.

* * * * *